(12) United States Patent
Fukai et al.

(10) Patent No.: US 9,362,522 B2
(45) Date of Patent: Jun. 7, 2016

(54) METHOD FOR BONDING SUBSTRATES, METHOD FOR MANUFACTURING SEALING STRUCTURE, AND METHOD FOR MANUFACTURING LIGHT-EMITTING DEVICE

(71) Applicant: Semiconductor Energy Laboratory Co., Ltd., Kanagawa-ken (JP)

(72) Inventors: Shuji Fukai, Kanagawa (JP); Yusuke Kubota, Kanagawa (JP); Mika Jikumaru, Kanagawa (JP); Takeshi Nishi, Kanagawa (JP); Akihisa Shimomura, Kanagawa (JP); Yoji Nagano, Kanagawa (JP); Daiki Nakamura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 121 days.

(21) Appl. No.: 14/059,660

(22) Filed: Oct. 22, 2013

(65) Prior Publication Data

US 2014/0116614 A1    May 1, 2014

(30) Foreign Application Priority Data

Oct. 26, 2012  (JP) .................................. 2012-236832

(51) Int. Cl.
  *B32B 37/14*   (2006.01)
  *H01L 51/52*   (2006.01)
  *C03C 8/24*   (2006.01)

(52) U.S. Cl.
  CPC .............. *H01L 51/5246* (2013.01); *C03C 8/24* (2013.01)

(58) Field of Classification Search
  CPC ........ H01L 51/5246; C03C 8/00; B32B 37/14
  See application file for complete search history.

(56) References Cited

U.S. PATENT DOCUMENTS

| | | | |
|---|---|---|---|
| 6,113,450 A | 9/2000 | Narayanan et al. | |
| 6,555,025 B1 * | 4/2003 | Krupetsky et al. | ............ 252/512 |
| 6,646,284 B2 | 11/2003 | Yamazaki et al. | |
| 6,803,246 B2 | 10/2004 | Yamazaki et al. | |
| 6,860,780 B2 | 3/2005 | Miyashita et al. | |
| 6,984,159 B1 | 1/2006 | Kado et al. | |
| 6,998,776 B2 | 2/2006 | Aitken et al. | |
| 7,121,642 B2 | 10/2006 | Stoessel et al. | |
| 7,407,423 B2 | 8/2008 | Aitken et al. | |
| 7,431,628 B2 | 10/2008 | Park et al. | |
| 7,602,121 B2 | 10/2009 | Aitken et al. | |
| 7,701,136 B2 | 4/2010 | Kwak | |
| 7,780,493 B2 | 8/2010 | Choi et al. | |

(Continued)

FOREIGN PATENT DOCUMENTS

| | | |
|---|---|---|
| JP | 5-208852 | 8/1993 |
| JP | 2011-65895 | 3/2011 |
| JP | 2011-70797 | 4/2011 |

*Primary Examiner* — Daniel McNally
(74) *Attorney, Agent, or Firm* — Husch Blackwell LLP

(57) ABSTRACT

An object is to improve productivity related to a laser light irradiation step in a bonding technique of substrates using glass frit. A highly airtight sealing structure or a highly airtight light-emitting device, which can be manufactured with high productivity, is provided. When a glass layer by melting glass frit or a sintered body by sintering glass frit is irradiated with laser light, in order to increase the efficiency, a light-absorbing material is attached to a surface of the glass layer. The laser light irradiation is performed on the light-absorbing material and the glass layer. The substrates are fixed with the glass layer therebetween.

8 Claims, 9 Drawing Sheets

(56) References Cited

U.S. PATENT DOCUMENTS

| | | |
|---|---|---|
| 7,837,530 B2 | 11/2010 | Park |
| 7,868,540 B2 | 1/2011 | Kim |
| 7,871,949 B2 | 1/2011 | Lee et al. |
| 7,944,143 B2 | 5/2011 | Choi et al. |
| 8,063,560 B2 | 11/2011 | Aitken et al. |
| 8,125,146 B2 | 2/2012 | Park |
| 8,164,257 B2 | 4/2012 | Choi et al. |
| 2004/0045663 A1* | 3/2004 | Katayama ........... B29C 65/1677 156/272.8 |
| 2007/0170854 A1 | 7/2007 | Kwak |
| 2010/0304513 A1* | 12/2010 | Nguyen et al. .................. 438/27 |
| 2011/0014427 A1* | 1/2011 | Burgess et al. ............... 428/149 |
| 2011/0209813 A1* | 9/2011 | Shibuya et al. ............ 156/89.12 |
| 2012/0318023 A1 | 12/2012 | Shimomura |

* cited by examiner

METHOD FOR BONDING SUBSTRATES, METHOD FOR MANUFACTURING SEALING STRUCTURE, AND METHOD FOR MANUFACTURING LIGHT-EMITTING DEVICE

BACKGROUND OF THE INVENTION

1. Field of the Invention

The present invention relates to a method for bonding a pair of substrates. Further, the present invention relates to a method for manufacturing a sealing structure. Further, the present invention relates to a method for manufacturing a light-emitting device.

2. Description of the Related Art

A technique is known in which two substrates are attached and bonded to each other with glass (hereinafter also referred to as a glass layer) obtained by melting or sintering glass frit containing low-melting-point glass as a main component. Further, a technique in which a highly airtight sealing structure is formed using the bonding technique of substrates is known. In a technique disclosed in Patent Document 1, a paste containing a binder and glass frit (referred to as a "frit material" in the document) including low-melting glass as a main component is applied to a glass substrate along an edge of the glass substrate, the binder is removed and the glass frit is melted to form a glass layer (referred to as a "frit glass" in the document) by baking of the paste, and the glass layer is irradiated with laser light with the glass substrate overlapping with a counter substrate so that the glass layer is welded to the counter substrate; thus, a highly airtight sealing structure is formed.

Since such a glass layer has a high gas barrier property, a sealed space can be kept away from the external atmosphere. A method of sealing using such a glass layer can be preferably used for a device employing an element, such as an organic EL (electroluminescent) element or an organic transistor, whose performance is rapidly impaired once the element is exposed to air (including moisture or oxygen).

Examples of the device employing an organic EL element are a lighting device using an organic EL element as a light source, an image display device in which a thin film transistor and an organic EL element are combined, and the like. Since the organic EL element can be formed into a film and a large-area organic EL element can be easily formed, a lighting device including a planar light source can be provided using the organic EL element. In addition, an image display device using an organic EL element needs no backlight which is necessary for a liquid crystal display device and the like, and accordingly, a thin, lightweight, and high contrast display device capable of driving with low power consumption can be achieved.

REFERENCE

[Patent Document 1] Japanese Published Patent Application No. 2011-65895

SUMMARY OF THE INVENTION

When a glass layer obtained by sintering a paste (hereinafter also referred to as a frit paste) including glass frit and a binder is welded to a substrate which is in contact with the glass layer, the glass layer is heated while scanning with laser light is performed along a pattern of the glass layer, whereby two substrates can be bonded to each other with the glass layer.

Here, in order to improve productivity of a device to which a sealing technique using the method for bonding is applied, in the laser irradiation step, an increase in efficiency of the step such as a reduction in time required for the step has been desired. In particular, as the size of a device sealed by the two glass substrates and the glass layer is increased, the scanning distance of laser light is increased; therefore, the productivity is greatly affected.

However, it has been difficult to increase the scanning rate of laser light from the following reason.

In the laser irradiation step, it is necessary to perform the laser light irradiation so that heating is performed to the extent that the entire of the glass layer or at least the vicinity of a bonding interface is almost completely melted. Here, in the case where heating on the glass layer is insufficient, a space might be generated in the glass layer itself or the bonding interface between the glass layer and a substrate to be bonded or separation is easily caused by insufficient bonding, for example. As a result, airtightness might be lost.

Further, in the case where the irradiation intensity of laser light is increased in order to increase the scanning rate of laser light, a sudden temperature change causes generation of a crack in the glass layer, the substrate, or the bonding interface and sufficient capability for sealing is not obtained in some cases.

Therefore, an object of one embodiment of the present invention is to improve productivity related to a laser light irradiation step in a bonding technique of substrates using glass frit. Further, an object of one embodiment of the present invention is to provide a highly airtight sealing structure or a highly airtight light-emitting device, which can be manufactured with high productivity.

In order to solve the problems, the inventors have arrived at an idea of increasing the efficiency of heating as compared to that in a conventional manner when a glass layer which is a melted body obtained by melting glass frit or a sintered body obtained by sintering glass frit is heated by irradiation with laser light. After the glass layer is formed by melting or sintering the glass frit, a material that absorbs laser light is attached to the glass layer so that the material is in contact with a top surface of the glass layer and the top surface is partially exposed, and the laser light irradiation is performed in a state where bonding surfaces between the exposed portion of the top surface of the glass layer and a substrate are in contact with each other.

That is, one embodiment of the present invention is a method for bonding substrates including the steps of forming a glass layer including a melted body or a sintered body of glass frit over a first substrate; attaching a light-absorbing material to a top surface of the glass layer so that the top surface is partially exposed; attaching closely the exposed portion of the top surface of the glass layer to the second substrate; and irradiating the glass layer and the light-absorbing material with laser light, whereby the glass layer is welded to the second substrate.

According to one embodiment of the present invention, with the light-absorbing material attached to the top surface of the glass layer, the top portion of the glass layer mainly welded to the second substrate can be effectively heated. Therefore, in the case where laser light having the same irradiation intensity as conventional laser light is used, the scanning rate can be improved and productivity can be improved. Further, in the case where the laser light irradiation is performed at a conventional laser scanning rate, laser light having small irradiation intensity can be used; therefore, productivity can be improved due to a reduction in power consumption of an apparatus for laser light irradiation.

Further, since a portion where the glass layer is welded to the second substrate can be efficiently heated, the adhesion or the bonding strength between the glass layer and the second substrate can be improved; generation of such a defect that a space is generated in the glass layer itself or in a portion where the glass layer is bonded to the second substrate can be suppressed. For example, even when the laser light irradiation is performed at conventional irradiation intensity and a conventional scanning rate, the glass layer can be more effectively heated; therefore, the bonding strength can be improved.

Further, in one embodiment of the present invention, the light-absorbing material preferably includes an organic pigment or an inorganic pigment.

Further, in one embodiment of the present invention, it is preferable that a resin in which the light-absorbing material is dispersed be formed over the glass layer and the resin be partially removed, whereby the light-absorbing material is attached to the glass layer.

With such a manner, the light-absorbing material can be used in a state where it is dispersed in a resin and thus is easily handled. Accordingly, for example, a variety of techniques for forming resins can be used. Further, by removal of a resin over the glass layer, the light-absorbing material can be easily attached to the glass layer.

Further, one embodiment of the present invention is a method for manufacturing a sealing structure in which in one embodiment of the present invention, the glass layer is formed to have a closed curve and irradiation with the laser light is performed while scanning is performed along the glass layer, whereby a closed space surrounded by the first substrate, the second substrate, and the glass layer is formed.

With such a method, a highly airtight sealing structure can be manufactured with high productivity.

Further, one embodiment of the present invention is a method for manufacturing a light-emitting device including the steps of forming a glass layer including a melted body or a sintered body of glass frit over a first substrate to have a closed curve; attaching a light-absorbing material to a top surface of the glass layer so that the top surface is partially exposed; forming a light-emitting element in which a layer containing a light-emitting organic compound is provided between a pair of electrodes over a second substrate; attaching closely the exposed portion of the top surface of the glass layer to the second substrate; irradiating the glass layer and the light-absorbing material with laser light so that the light-emitting element is provided in a closed space surrounded by the first substrate, the second substrate, and the glass layer, whereby the glass layer is welded to the second substrate.

With such a method, a light-emitting element is sealed in a highly airtight closed space and a significantly reliable light-emitting device can be manufactured with high productivity.

Further, in one embodiment of the present invention, it is preferable that a resin in which the light-absorbing material is dispersed be formed over the first substrate and the glass layer, and the resin be partially removed, whereby the light-absorbing material is attached to the glass layer, and a color filter including the resin and the light-absorbing material be formed in a region of the first substrate over which the glass layer is not provided.

With such a method, as the light-absorbing material attached to the glass layer, a light-absorbing material such as a pigment included in a color filter can be used. Further, since the light-absorbing material can be concurrently attached to the glass layer in the process for forming the color filter, without an increase in the number of steps or an increase in the amount of materials, a highly reliable light-emitting device can be manufactured.

Further, in one embodiment of the present invention, it is preferable that the glass layer have an uneven top surface.

With the use of the glass layer having such a shape, the light-absorbing material can be trapped and fixed in recessed portions of the surface of the glass layer. In particular, in the case where a granular pigment is used as the light-absorbing material, particles of the pigment can be effectively fixed on the surface of the glass layer.

Further, in one embodiment of the present invention, it is preferable that the glass layer be formed over the first substrate so that an end portion of the glass layer has a tapered shape.

The glass layer is formed to have such a shape, whereby the area in which the glass layer and the first substrate are bonded to each other can be increased, and the adhesion or the bonding strength can be improved. Further, as described above, the light-absorbing material is provided on the top surface of the glass layer, whereby the adhesion or the bonding strength between the glass layer and the second substrate can be increased; therefore, the adhesion or the bonding strength between the first substrate and the second substrate can be significantly increased.

Further, the glass layer is formed so that the end portions thereof have tapered shapes, whereby the light-absorbing material can be uniformly attached to an exposed surface of the glass layer; therefore, the glass layer can be efficiently heated by the laser light irradiation which is performed later. Further, particularly in the case where the light-absorbing material is formed by a spin coating method, with such a shape, nonuniformity in the amount (the density) of attachment of the light-absorbing material 105 due to steps at the edge portions of the glass layer can be suppressed.

Note that a "closed curve" in this specification and the like means a continuous curve with no endpoints. Further, here, a "curve" includes concepts of a straight line and a line segment in its broad sense. Therefore, a shape in which a plurality of line segments is included and every end point of the line segments overlaps with another end point, such as a periphery of a quadrangle, is also one mode of the closed curve shape. Further, a circle, an ellipse, a shape in which a plurality of curves having different curvatures is continuously connected, a shape including a straight linear portion and a curve portion, and the like are also modes of the closed curve shape.

Note that a light-emitting device in this specification means an image display device or a light source (including a lighting device). In addition, the light-emitting device includes any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted over a substrate over which a light-emitting element is formed by a chip on glass (COG) method.

According to the present invention, productivity related to a laser light irradiation step in a bonding technique of substrates using glass fit can be improved. Further, a highly airtight sealing structure or a highly airtight light-emitting device, which can be manufactured with high productivity, can be provided.

DETAILED DESCRIPTION OF THE INVENTION

Figure 1A:
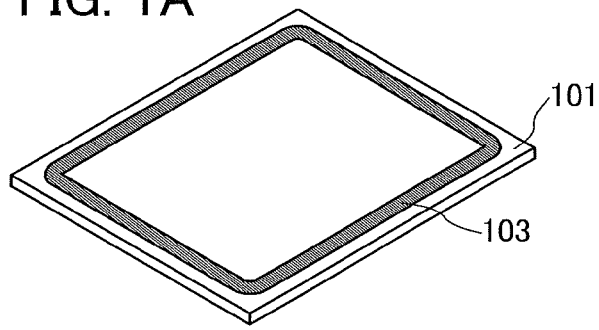
FIGS. 1A to 1D illustrate a method for bonding substrates and a method for manufacturing a sealing structure, according to one embodiment of the present invention.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

Embodiment 1

In this embodiment, a method for bonding substrates which is one embodiment of the present invention and a manufacturing method of a sealing structure using the method for bonding are described.

First, a frit paste 103 including glass frit is formed as a pattern over a first substrate 101 (FIG. 1A). Here, the frit paste 103 is formed as a pattern to have a closed curve along the outer periphery of the first substrate 101.

Note that in the case where the first substrate 101 and a second substrate 102 described later are only simply bonded, that is, in the case where a sealed region surrounded by these two substrates and a glass layer does not need to be formed, the frit paste 103 does not need to be formed as a pattern to have a closed curve and may be formed over only a bonding portion.

The frit paste 103 includes at least glass frit including low-melting-point glass and a binder. The binder includes an organic resin or an organic solvent. Further, the frit paste 103 may include a material that absorbs laser light which is used in a laser light irradiation step performed later.

A glass material used for the glass frit preferably contains one or more compounds selected from, for example, the following group: magnesium oxide, calcium oxide, barium oxide, lithium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, titanium oxide, tungsten oxide, bismuth oxide, antimony oxide, lead borate glass, tin phosphate glass, vanadate glass, and borosilicate glass.

The frit paste 103 can be formed as a pattern over the first substrate 101 by a printing method such as a screen printing method, a dispensing method, or the like.

Figure 1B:
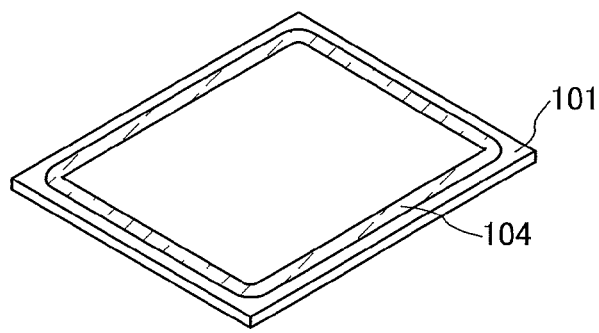

Then, the frit paste 103 is heated, so that the glass frit in the frit paste 103 is melted or sintered to form a glass layer 104 (FIG. 1B).

The frit paste 103 may be heated using a heating apparatus such as a baking furnace, an oven, or a hot plate or may be locally heated by laser light irradiation.

By heating of the frit paste 103, the binder in the frit paste 103 is removed. Further, the glass frit is melted or is sintered to form a whole, and then cooling is performed, whereby the glass layer 104 including a melted body or a sintered body of the glass frit is formed. At this time, in the glass layer 104, the glass frit may be completely melted and then welded to form a whole or the glass frit may be partially welded. Note that it is preferable that the binder be completely removed, although it might fail to be completely removed and remain on a surface of or inside the glass layer 104 depending on the conditions for heating the frit paste 103.

Figure 1C:
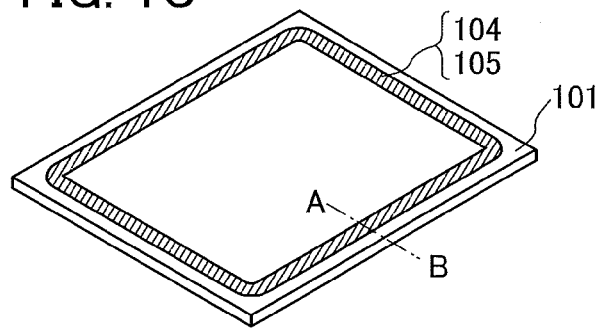

Next, a light-absorbing material 105 is attached to the glass layer 104 so that a top surface of the glass layer 104 is partially exposed (FIG. 1C).

A material that absorbs laser light which is used in the laser light irradiation step performed later is used as the light-absorbing material 105. For example, particles or a thin film which has a light absorbing property can be used.

As examples of the particles with a light absorbing property, an inorganic pigment, an organic pigment, and glass particles including metal or metal oxide can be given, for example.

As the inorganic pigment, an iron oxide-based material, a chromium-based material, a vanadium-chromium-based material, a cobalt aluminate-based material, a vanadium-zirconium-based material, or a cobalt-chromium-iron-based material can be used, for example. Alternatively, carbon black can be used.

As the organic pigment, in addition to a pigment that absorbs light in the visible light range such as an azo-based pigment, an anthraquinone-based pigment, a naphthoquinone-based pigment, an isoindolinone-based pigment, a perylene-based pigment, an indigo-based pigment, a fluorenone-based pigment, a phenazine-based pigment, a phenothiazine-based pigment, a polymethine-based pigment, a polyene-based pigment, a diphenylmethane-based pigment, a triphenylmethane-based pigment, a quinacridone-based pigment, an acridine-based pigment, a phthalocyanine-based pigment, or a quinophthalocyanine-based pigment, a pigment absorbing light in the ultraviolet range such as a benzotriazole-based compound, a hydroxybenzophenone-based compound, or a salicylate-based compound can be used.

Further, light-transmitting glass including metal or metal oxide as a colored component may be used as the glass particles that absorb light. Alternatively, particles in which the above-described inorganic pigment is dispersed in light-transmitting glass can be used.

In the case where the particles with a light absorbing property are used as the light-absorbing material 105, it is preferable that the particle size be as small as possible because the particles can be uniformly attached to a surface of the glass layer 104. Further, particularly in the case where a pigment is used as the light-absorbing material 105, it is preferable that the particle size be as small as possible because laser light transmittance can be improved, in which case a reduction in the intensity of laser light reaching the inside of the glass layer 104 is suppressed in the laser light irradiation step which is performed later and thus the top surface and the inside of the glass layer 104 can be efficiently heated.

The size of the particle with a light absorbing property which is used for the light-absorbing material 105 is greater than or equal to 1 nm and less than or equal to 10 μm, preferably, greater than or equal to 1 nm and less than or equal to 1 μm, more preferably, greater than or equal to 1 nm and less than or equal to 100 nm.

Further, such particles with a light absorbing property can be used in a state where the particles are dispersed in an organic resin. By dispersion of the particles in an organic resin, easy handling can be achieved. Furthermore, the particles with a light absorbing property can be used in a state where the particles are dispersed in liquid. Note that it is preferable that a dispersant be added to the mixture of the particles with a light absorbing property and the organic resin or the liquid in order to improve dispersion property.

Further, as the thin film with a light absorbing property, a thin film of an inorganic material or a thin film of an organic material can be used.

As the thin film with a light absorbing property of an inorganic material, a silicon film containing nitrogen, such as a silicon nitride film or a silicon oxynitride film, or metal oxide or metal nitride, such as titanium oxide or titanium nitride, can be used. Further, a metal thin film which is thin enough to have a light-transmitting property can be used.

Here, in the case where a thin film of an inorganic material is used as the light-absorbing material 105, it is preferable that an oxide or an oxide containing nitrogen be used because the adhesion of the light-absorbing material 105 to the second substrate 102 which is bonded to the glass layer 104 is improved.

As the thin film with a light absorbing property of an organic material, a variety of colored organic resins such as polyimide can be used. In addition, a material obtained by coloring a transparent organic resin such as acrylic with a dye may be used.

An example of a method in which the light-absorbing material 105 is attached to a surface of the glass layer 104 is described below.

Example 1 of Method for Forming Light-Absorbing Material 105

First, the case where the particles with a light absorbing property are used as the light-absorbing material 105 is described.

Liquid in which the particles with a light absorbing property are dispersed is applied to the glass layer 104. Although the liquid may be applied onto an entire surface of the first substrate 101 by a spin coating method or the like, it is preferable that the liquid be discharged directly on the glass layer 104 by an inkjet method because the material can be efficiently used.

As the liquid to be used, it is preferable to use a material which boils at a temperature exceeding room temperature.

After that, the first substrate 101 is heated at a temperature higher than or equal to the boiling point of the liquid to volatilize the liquid. By the volatilization of the liquid, the light-absorbing material 105 formed using the particles with a light absorbing property, which have been dispersed, can be attached to the top surface of the glass layer 104.

Figure 2A:
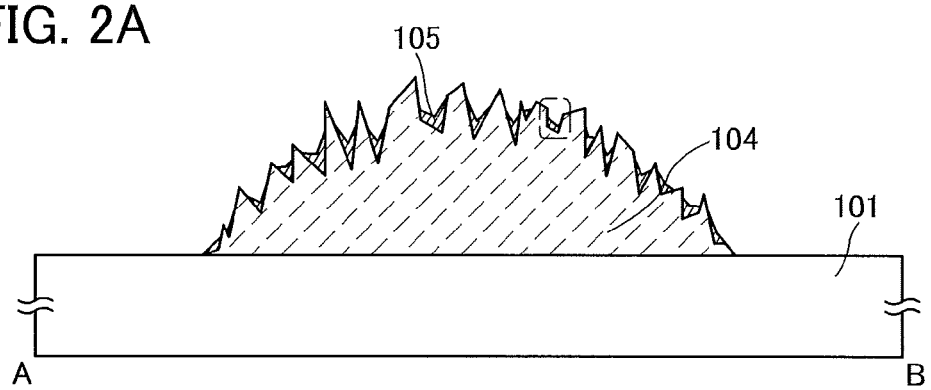
FIGS. 2A and 2B illustrate a method for bonding substrates and a method for manufacturing a sealing structure, according to one embodiment of the present invention.
Figure 2B:
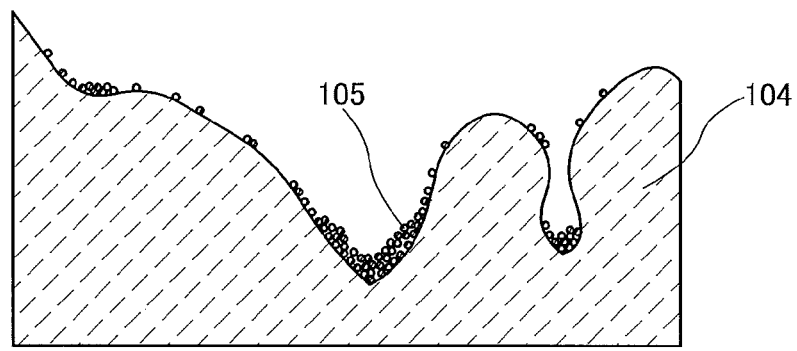

FIG. 2A illustrates a schematic cross section of the glass layer 104 and the like at this stage. FIG. 2A is a schematic cross-sectional view taken along line A-B in FIG. 1C. FIG. 2B is an enlarged schematic view of a region indicated by a dashed line in FIG. 2A.

As illustrated in FIG. 2A, it is preferable that the top surface of the glass layer 104 have an uneven shape. With such a shape, most of the light-absorbing material 105 is attached to recessed portions and the light-absorbing material 105 is hardly attached to projected portions; therefore, the top surface of the glass layer 104 can be partially exposed without a particular step. Further, since the particles having small sizes are used as the light-absorbing material 105, as illustrated in FIG. 2B, the particles can be captured and fixed in the recessed portions of the surface of the glass layer 104.

In order to form the glass layer 104 having such a shape, the heating conditions (the heating temperature, the heating time, and the like) in the above-described heating treatment of the frit paste should be adjusted to the extent that the glass frit is not completely melted, but the shape of the glass frit is reflected.

Further, the glass layer 104 is formed so that the end portions thereof have tapered shapes, whereby the light-absorbing material 105 can be uniformly attached to the exposed surface of the glass layer; therefore, the glass layer 104 can be efficiently heated by the laser light irradiation which is performed later. Further, particularly in the case where the light-absorbing material 105 is formed by a spin coating method, with such a shape, nonuniformity in the amount (the density) of attachment of the light-absorbing material 105 due to steps at the edge portions of the glass layer can be suppressed. Note that in this specification and the like, an end portion of an object having a tapered shape indicates that the end portion of the object has a cross-sectional shape in which the angle between a surface of the object and a surface on which the object is formed is greater than 0° and less than 90° in a region of the end portion, preferably, greater than or equal to 5° and less than or equal to 70°, and the thickness continuously increases from the end portion.

By the above-described method, the particles with a light absorbing property can be attached to the surface of the glass layer 104 as the light-absorbing material 105.

Example 2 of Method for Forming Light-Absorbing Material 105

Next, the case where particles with a light absorbing property which are dispersed in an organic resin are used as the light-absorbing material 105 is described.

Figure 3A:
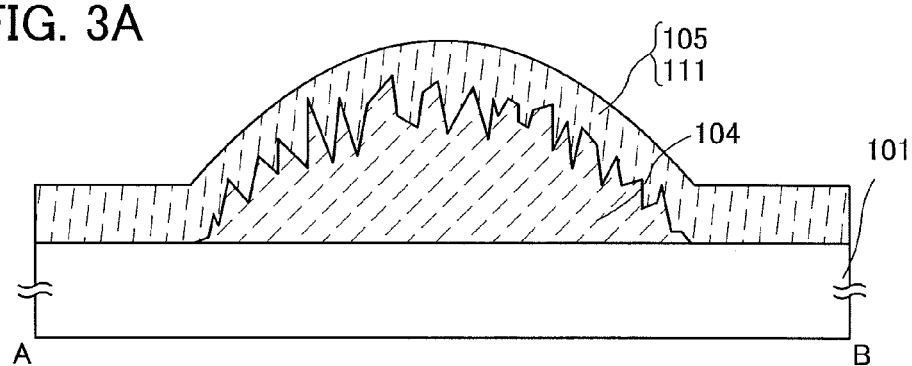
FIGS. 3A to 3C illustrate a method for bonding substrates and a method for manufacturing a sealing structure, according to one embodiment of the present invention.

First, a resin 111 in which the light-absorbing material 105 is dispersed is formed to cover the glass layer 104 (FIG. 3A).

As the resin 111, a photosensitive organic resin or a non-photosensitive organic resin can be used.

The resin 111 can be formed by a spin coating method, a printing method such as a screen printing method, a dispensing method, an inkjet method, or the like. Note that after application of the resin 111, an organic solvent or the like included in the resin 111 may be removed by heat treatment.

Here, since the resin 111 has high coverage, the resin 111 can be formed thin in projected portions of the glass layer 104 and can be formed thick in recessed portions. In FIG. 3A, the case where the glass layer 104 has an uneven surface is illustrated; however, even when the glass layer 104 does not have a significantly uneven surface, for example, in the case where a cross section of the glass layer 104 is a circular arc-shaped cross section or a rectangular shaped cross section, as long as the glass layer 104 has a shape with a top portion, a corner portion, or the like, the resin 111 is formed thin in the portion.

After that, the resin 111 is removed. When the resin 111 is removed, the light-absorbing material 105 which has been dispersed in the resin 111 is exposed to be directly in contact with the glass layer 104, whereby the light-absorbing material 105 is attached to the surface of the glass layer 104 (FIG. 3B).

In the case of using a photosensitive organic resin as the resin 111, the resin 111 can be removed by performing development treatment (or light exposure treatment and development treatment). Further, in the case of using a non-photosensitive organic resin as the resin 111, the resin 111 can be removed by wet etching or dry etching.

Figure 3B:
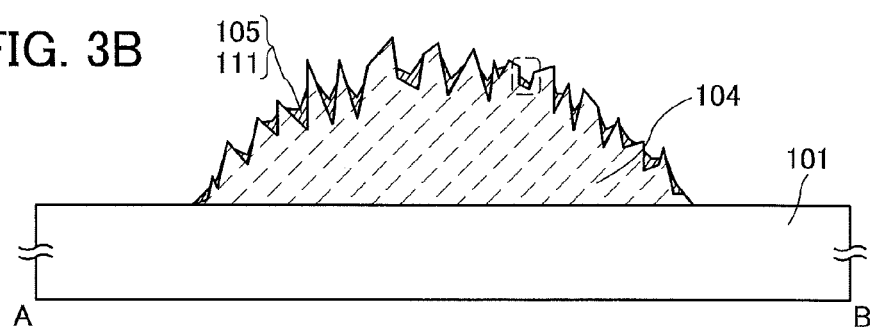
Figure 3C:
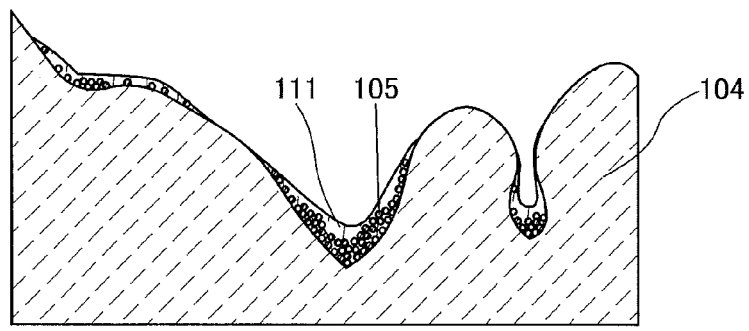

FIG. 3C is an enlarged schematic view of a region indicated by a dashed line in FIG. 3B. As illustrated in FIG. 3C, part of the resin 111 remains on the light-absorbing material 105 without being removed in the recessed portions of the surface of the glass layer 104 by the etching or the development treatment described above in some cases. In such a manner, part of the resin 111 is left, whereby the light-absorbing material 105 can be reliably fixed on the surface of the glass layer 104, which is preferable.

By the above-described method, the particles with a light absorbing property can be attached to the surface of the glass layer 104 as the light-absorbing material 105.

Example 3 of Method for Forming Light-Absorbing Material 105

Next, the case where a thin film with a light absorbing property is used as the light-absorbing material 105 is described.

Figure 4A:
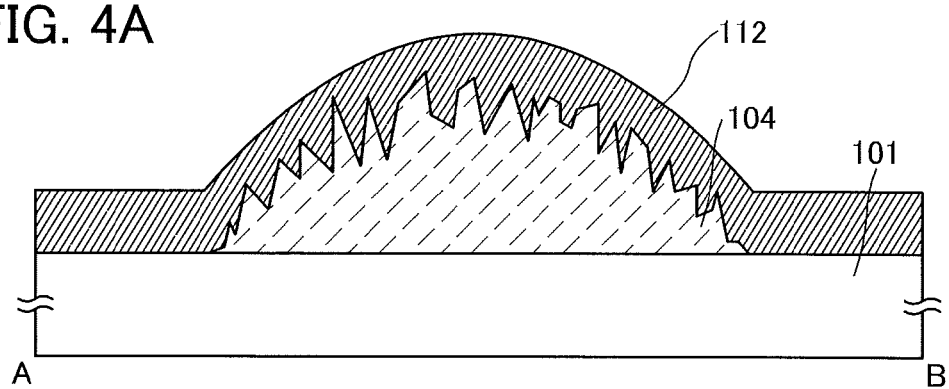
FIGS. 4A to 4C illustrate a method for bonding substrates and a method for manufacturing a sealing structure, according to one embodiment of the present invention.

First, a thin film 112 including a material with a light absorbing property is formed to cover the glass layer 104 (FIG. 4A).

In the case where a thin film of an organic material is used as the thin film 112, the thin film 112 can be formed by a spin coating method, a printing method such as a screen printing method, a dispensing method, an inkjet method, or the like. Note that the thin film 112 may be formed in the following manner after application of a resin, an organic solvent or the like is removed by heat treatment. Alternatively, the thin film 112 may be formed by a vacuum evaporation method.

In the case where a thin film of an inorganic material is used as the thin film 112, the thin film 112 can be formed by a formation method such as a sputtering method, a vacuum evaporation method, or a CVD method.

The thin film 112 is preferably formed to cover an uneven shape of the surface of the glass layer 104. At this time, the thin film 112 is preferably formed thin in projected portions of the surface of the glass layer 104 and is preferably formed thicker in recessed portions than in the projected portions.

Figure 4B:
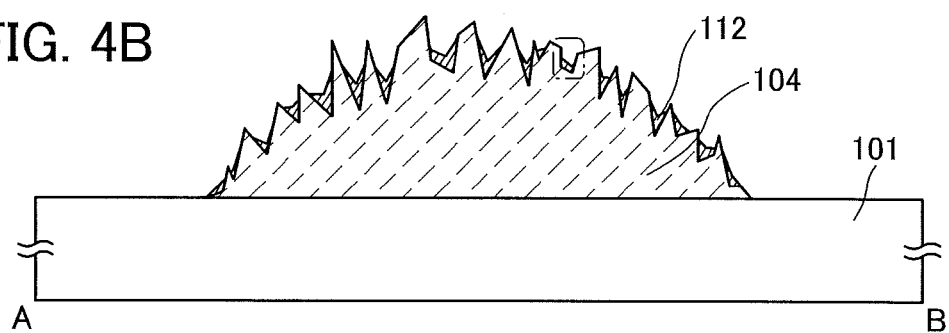
Figure 4C:
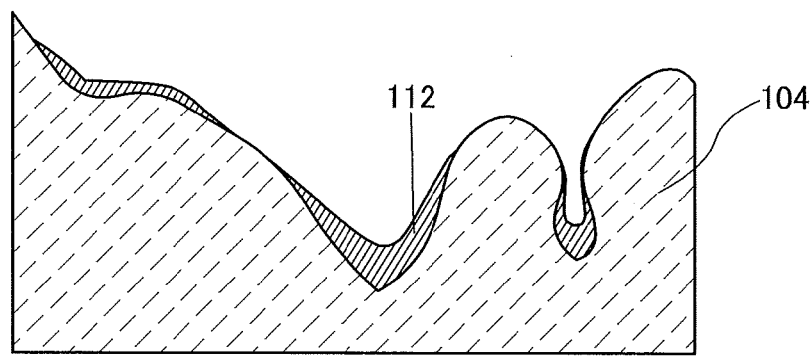

Next, the thin film 112 is partially etched, so that the top surface of the glass layer 104 is exposed (FIGS. 4B and 4C). The etching can be performed by wet etching or dry etching.

At this time, the etching is performed so that the thin film 112 in the projected portions of the surface of the glass layer 104 is eliminated first and the thin film 112 having a relatively thick thickness in the recessed portions is left, whereby the top surface of the glass layer 104 can be partially exposed.

In such a manner, the light-absorbing material 105 can be attached to the top surface of the glass layer 104.

Note that in the case where the thin film 112 is formed by a formation method such as a vacuum evaporation method, a sputtering method, or a CVD method, there is not a difference between the thickness of the thin film 112 formed in the projected portions of the glass layer 104 and the thickness of the thin film 112 formed in the recessed portions in some cases. In such a case, after the thin film 112 is formed, anisotropic dry etching treatment is performed, whereby part of the thin film 112 can be left on side surfaces of the projected portions or the recessed portions of surfaces of the glass layer 104. Alternatively, an etching mask may be formed to cover part of the glass layer 104 and the thin film 112 in a region which is not covered with the etching mask may be etched to partially expose the top surface of the glass layer 104.

The above is the description of the method for attaching the light-absorbing material 105 to the top surface of the glass layer 104.

Figure 1D:
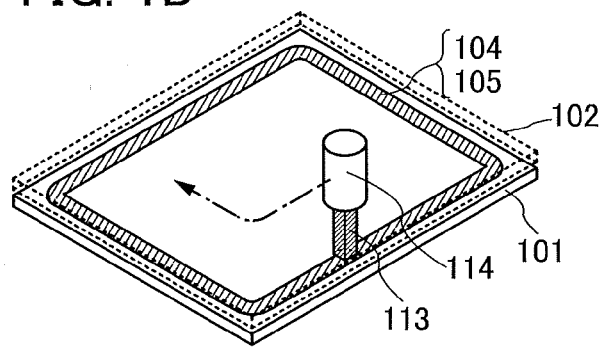

Next, the second substrate 102 is arranged so as to face the first substrate 101. At this time, the second substrate 102 is provided so that the surface of the second substrate 102 is in contact with the exposed portion of the top surface of the glass layer 104. After that, at least the top surface of the glass layer 104 is melted by irradiation of the glass layer 104 with a laser light 113, whereby the glass layer 104 and the second substrate 102 are bonded to each other (FIG. 1D).

In the irradiation step with the laser light 113, the glass layer 104 is preferably irradiated with light which has passed through the first substrate 101 or the second substrate 102. At this time, for the substrate irradiated with the laser light 113, a light-transmitting material to the laser light 113 is used.

In addition, the irradiation with the laser light 113 is performed while scanning is performed along the glass layer 104. At this time, the irradiation may be performed while the first substrate 101 over which the glass layer 104 is provided and/or an exit 114 through which the laser light 113 is emitted is moved.

As the exit 114 through which the laser light 113 is emitted, for example, an optical fiber is used and may be directly connected to a laser apparatus so that the laser light 113 can be extracted. Any of mirrors and lenses may be combined so that the laser light 113 can be extracted.

By the irradiation with the laser light 113, the glass layer 104 itself is heated and the light-absorbing material 105 attached to the top surface of the glass layer 104 is also heated. Since the top surface of the glass layer 104 can be efficiently heated by heat generation from the light-absorbing material 105, irradiation energy of the laser light 113, which is necessary for bonding the glass layer 104 and the second substrate 102 to each other, can be reduced. That is, power consumption is reduced by improvement of the scanning rate of the laser light 113 or a reduction in irradiation intensity of the laser light 113, whereby productivity can be increased.

Further, since a portion where the glass layer 104 is welded to the second substrate 102 can be efficiently heated, the adhesion or the bonding strength between the glass layer 104 and the second substrate 102 can be improved. Further, insufficient heating on the glass layer 104 prevents a problem in that a space is generated in the glass layer 104 itself or in a portion where the glass layer 104 is bonded to the second substrate 102, so that a highly reliable sealing structure having high airtightness and high mechanical strength can be manufactured.

Further, in the method for bonding substrates which is one embodiment of the present invention, with the use of the light-absorbing material 105, the vicinity of the interface between the glass layer 104 and the second substrate 102 can be efficiently heated; therefore, even when a material which does not include a material that absorbs the laser light 113 is used as the frit paste 103 and the glass layer 104 itself does not absorb the laser light 113, the glass layer 104 and the second substrate 102 can be reliably bonded to each other. Therefore, a material which includes only a glass material and a binder can be used as the frit paste 103 and thus cost can be reduced. Alternatively, in the case where a material which includes a material that absorbs the laser light 113 is used as the frit paste 103, both of the glass layer 104 and the light-absorbing material 105 are heated by irradiation with the laser light 113; therefore, even the inside of the glass layer 104 can be efficiently heated and the glass layer 104 and the second substrate 102 can be bonded to each other more reliably.

Through the above process, the first substrate 101 and the second substrate 102 can be bonded to each other with the glass layer 104.

Figure 5A:
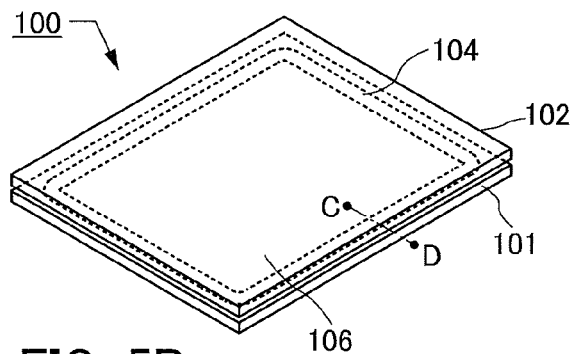
FIGS. 5A to 5C illustrate a sealing structure, according to one embodiment of the present invention.
Figure 5B:
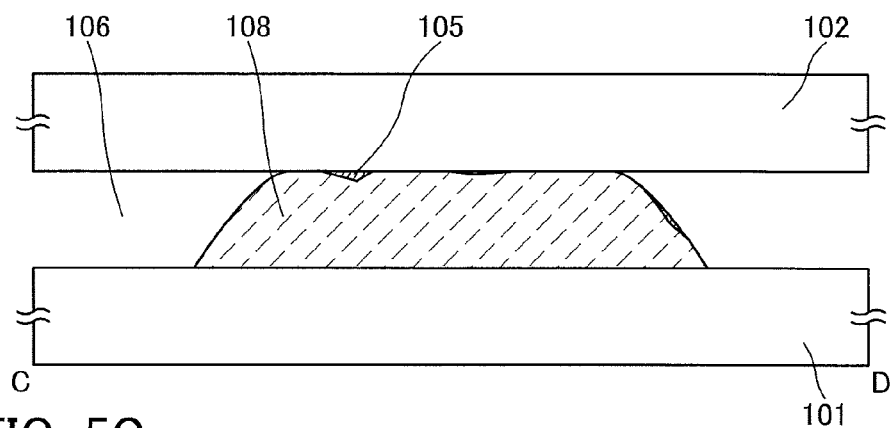
Figure 5C:
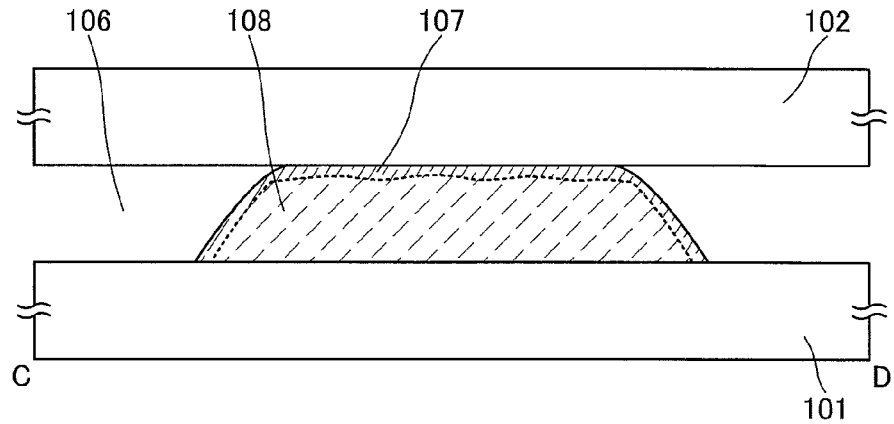

FIG. 5A illustrates a schematic view of a sealing structure 100 manufactured through the above process. The sealing structure 100 includes a sealed region 106 that is a closed space surrounded by the first substrate 101, the second substrate 102, and the glass layer 104. FIGS. 5B and 5C illustrate examples of cross sections taken along line C-D in FIG. 5A.

In the above process, as illustrated in FIG. 2A, for example, the glass layer 104 is formed so that the end portions thereof have tapered shapes and the width of the glass layer 104 seen from the above coincides with the width of a contact surface between the glass layer 104 and the first substrate 101, whereby in a glass layer 108 after bonding, the contact area between the glass layer 108 and the first substrate 101 can be larger than the contact area between the glass layer 108 and the second substrate 102 as illustrated in FIG. 5B. As described above, the contact area between the first substrate 101 and the glass layer 108 is increased, whereby the adhesion or the bonding strength can be improved.

Further, as illustrated in FIG. 5B, part of the light-absorbing material 105 segregates or aggregates to remain between the glass layer 108 and the second substrate 102 after bonding in some cases. At this time, in the case where the area of a region where the light-absorbing material 105 remains when seen from the above, that is, the area of a region which is obtained by projecting the region on a surface parallel to a surface where the first substrate 101 is formed is sufficiently smaller than the area of contact between the glass layer 108 and the second substrate 102, for example, 10% or smaller of the area of contact between the glass layer 108 and the second substrate 102, the bonding strength is hardly affected.

Further, in the case of using an inorganic material such as metal, metal oxide, metal nitride, a silicon nitride film, or a silicon oxynitride film as the light-absorbing material 105, the inorganic material is diffused into the glass layer 108 after bonding by the irradiation with the laser light 113 and a diffusion layer 107 is formed as illustrated in FIG. 5C in some cases. The diffusion layer 107 includes both of a glass material to form the glass layer 108 and a material used for the light-absorbing material 105. Therefore, the diffusion layer 107 itself can be welded to the second substrate 102. The diffusion layer 107 is preferably used because a reduction in bonding strength between the glass layer 108 and the second substrate 102 can be suppressed.

Further, in the concentration of the material used for the light-absorbing material 105 in the diffusion layer 107, a concentration gradually reduces from a surface of the glass layer 108 to the inside of the glass layer 108 in some cases. Note that since a boundary between the glass layer 108 and the diffusion layer 107 is not clear in some cases, the boundary is indicated by a dotted line in FIG. 5C. With the continuous gradual change of the concentration from the diffusion layer 107 to the glass layer 108, the internal stress of the diffusion layer 107 itself or the internal stress around the boundary between the diffusion layer 107 and the glass layer 108 is suppressed and a defect such as generation of a crack can be suppressed; thus, a highly reliable sealing structure can be obtained.

The above is the description of the structural example of a sealing structure which can be manufactured using the method for manufacturing a sealing structure of one embodiment of the present invention.

This embodiment can be combined with any of the other embodiments disclosed in this specification as appropriate.

Embodiment 2

In this embodiment, an example of a method for manufacturing a light-emitting device using the method for bonding which is one embodiment of the present invention is described. Note that description of the portions already described in Embodiment 1 is omitted or is simplified.

Figure 6A:
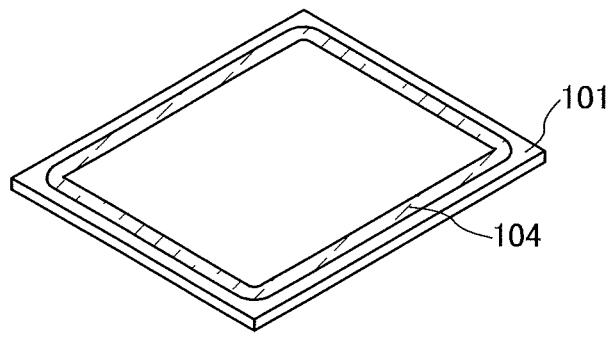
FIGS. 6A to 6C illustrate a method for manufacturing a light-emitting device, according to one embodiment of the present invention.

First, as in Embodiment 1, after the frit paste 103 is formed as a pattern over the first substrate 101, the frit paste 103 is heated to form the glass layer 104 (FIG. 6A).

Figure 6B:
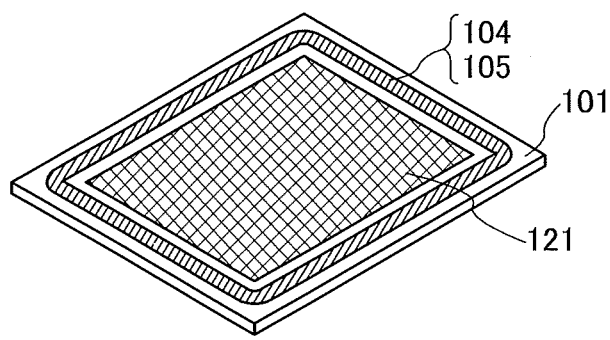

Next, a color filter 121 is formed in a region surrounded by the glass layer 104 over the first substrate 101. At the same time, the light-absorbing material 105 is formed over the glass layer 104 (FIG. 6B).

As the color filter 121, a resin including the particles with a light absorbing property described in Embodiment 1 as a pigment can be used.

As a method for framing the color filter 121, for example, an etching method, a color resist method, and the like are given.

In the case where color filters having different colors are formed by an etching method, the following steps are performed: a resin in which a pigment of a first color is dispersed is applied to the first substrate 101 by a spin coating method or the like, and then dried. Next, after a resist mask is formed over the resin and an unnecessary portion of the resin is removed by etching, the resist mask is removed, whereby a color filter of the first color can be formed. Next, as in the above, a color filter of a second color is formed using a resin in which a pigment of the second color is dispersed, whereby the color filters having different colors can be formed.

Alternatively, in the case of using a color resist method, a photosensitive resin whose solubility in a developer changes by light irradiation and in which a pigment is dispersed is used, and the photosensitive resin is applied by a spin coating method or the like and then is dried. After that, light exposure is performed using a photomask and development treatment is performed, whereby a pattern of a color filter can be formed.

In either formation method, at the time of application of the resin including the particles with a light absorbing property as a pigment, the particles with a light absorbing property can be attached also to the top surface of the glass layer 104 and the particles can be used as the light-absorbing material 105. Therefore, the light-absorbing material 105 can be formed over the glass layer 104 without an increase in the number of steps.

Note that an example in which a material including the particles with a light absorbing property is used as a material of the color filter 121 is described above; however, a material for coloring transmitted light a desired color may be used and the thin film with a light absorbing property described in Embodiment 1 can be used, for example. In that case, the color filter 121 can be formed by a photolithography method or the like. Also in the case of using the thin film with a light absorbing property, the thin film is formed also over the glass layer 104 in the film deposition, whereby the light-absorbing material 105 can be formed over the glass layer 104 without an increase in the number of steps.

Figure 6C:
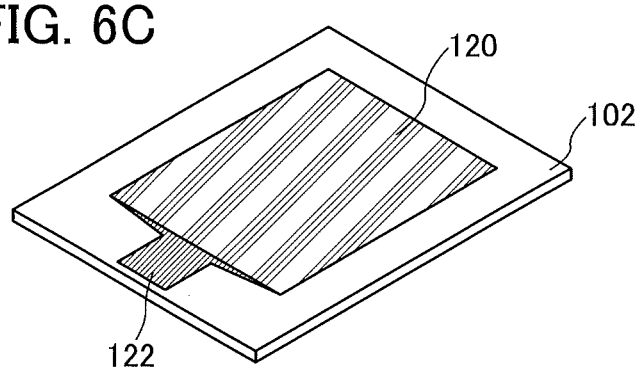

Next, the second substrate 102 provided with a light-emitting module 120 is prepared (FIG. 6C). The light-emitting module 120 is provided on one surface of the second substrate 102. In addition, a wiring 122 through which a power source potential, a signal, and the like for driving the light-emitting module 120 are input from the outside is formed on the surface where the light-emitting module 120 is provided.

As the light-emitting module 120, for example, an active matrix image display device, a passive matrix image display device, or a lighting device which includes an organic EL element can be used. By application of a color filter to an image display device, display quality can be improved. Further, by application of a color filter to a lighting device, a light emission color can be adjusted to a desired color. Further, the light-emitting module 120 may include a driver circuit, a wiring, or the like for light emission of an organic EL element.

The light-emitting module 120 can be manufactured by any of a variety of manufacturing methods. For example, in the case of using an active matrix image display device including an organic EL element, a gate electrode (and a wiring), a gate insulating layer, a semiconductor layer, and a source electrode and a drain electrode (and wirings) which form a transistor are provided over the second substrate. After that, a first electrode which is electrically connected to the transistor, a layer including a light-emitting organic compound, and a second electrode are stacked in this order to form an organic EL element. Note that the first electrode and the source electrode or the drain electrode of the transistor may be used in common.

Note that the structural example of the light-emitting module 120 is described in detail in an embodiment below.

Figure 7A:
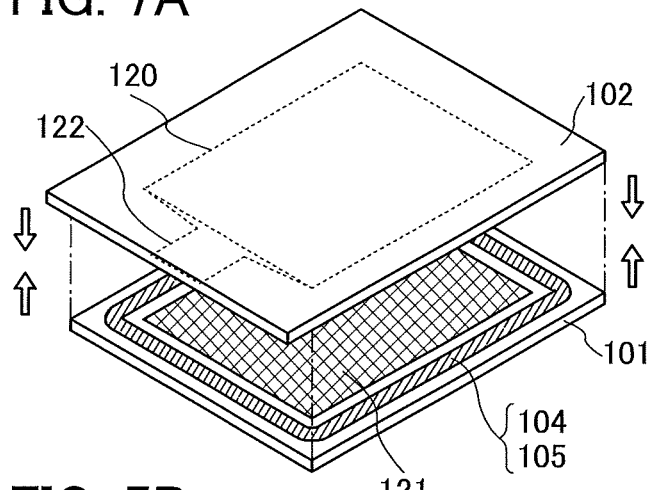
FIGS. 7A and 7B illustrate a method for manufacturing a light-emitting device, according to one embodiment of the present invention.

Next, the first substrate 101 and the second substrate 102 are provided so that the glass layer 104 is in contact with the top surface of the second substrate 102 (FIG. 7A).

After that, as in Embodiment 1, the glass layer 104 is irradiated with the laser light 113 (not shown) so that the glass layer 104 is welded to the second substrate 102, whereby the first substrate 101 and the second substrate 102 are bonded to each other with the welded glass layer 108.

Figure 7B:
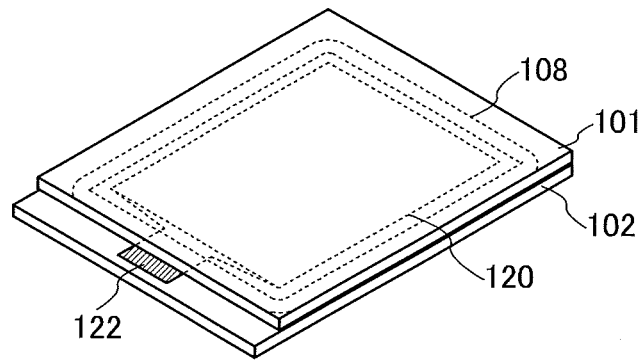

Through the above process, a light-emitting device 150 in which the light-emitting module 120 is sealed in a sealed region surrounded by the first substrate 101, the second substrate 102, and the glass layer 108 can be manufactured (FIG. 7B).

By such a method, a highly reliable light-emitting device can be manufactured with high productivity. Further, the color filter 121 and the light-absorbing material 105 can be formed at the same time without an increase in the number of steps; therefore, productivity can be improved.

This embodiment can be combined with any of the other embodiments disclosed in this specification as appropriate.

Embodiment 3

A sealing structure to which the method for bonding substrates which is one embodiment of the present invention is applied has significantly high airtightness, and thus can be used in various devices including an element such as an organic EL element, an organic semiconductor element, or an organic solar cell, whose performance is rapidly decreased once the element is exposed to the air (including moisture or oxygen). Further, the method for forming a sealing structure which is one embodiment of the present invention can be also used for devices having low heat resistance and the above-described various devices can be manufactured with high productivity.

As a light-emitting device including an organic EL element, a display device, a lighting device, or the like can be given. As a display device including an organic EL element, a display device employing a passive matrix mode (i.e., simple matrix mode) or an active matrix mode can be given. A structural example of a display device employing an active matrix mode will be described below.

Figure 8A:
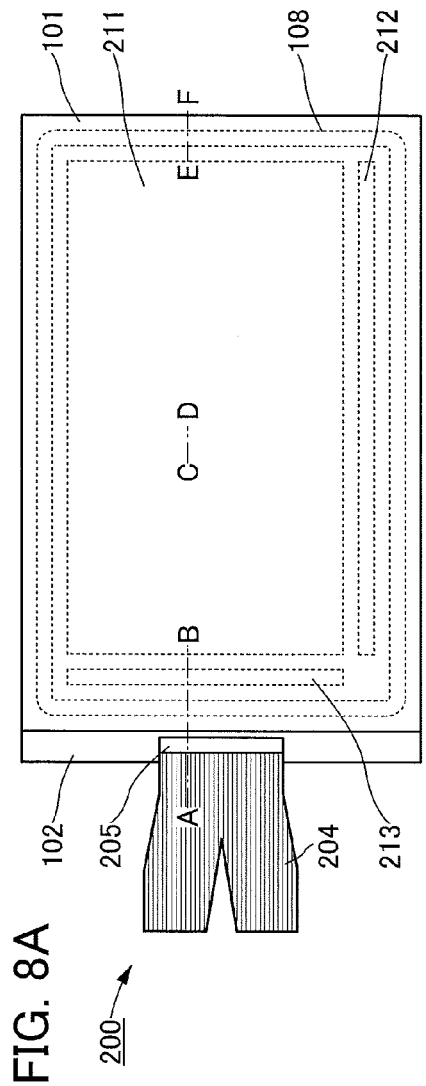
FIGS. 8A and 8B illustrate a light-emitting device, according to one embodiment of the present invention.

FIG. 8A is a schematic top view of a display device 200 shown in this embodiment.

The display device 200 includes a display portion 211 provided with a plurality of pixels, a source driver circuit 212, and a gate driver circuit 213 in the sealed region surrounded by the first substrate 101, the second substrate 102, and the glass layer 108. Further, an external connection electrode 205 is provided in a region outside the sealed region over the second substrate 102. A power supply or a signal for driving the display portion 211, the source driver circuit 212, the gate driver circuit 213, and the like can be input from an FPC 204 electrically connected to the external connection electrode 205.

Figure 8B:
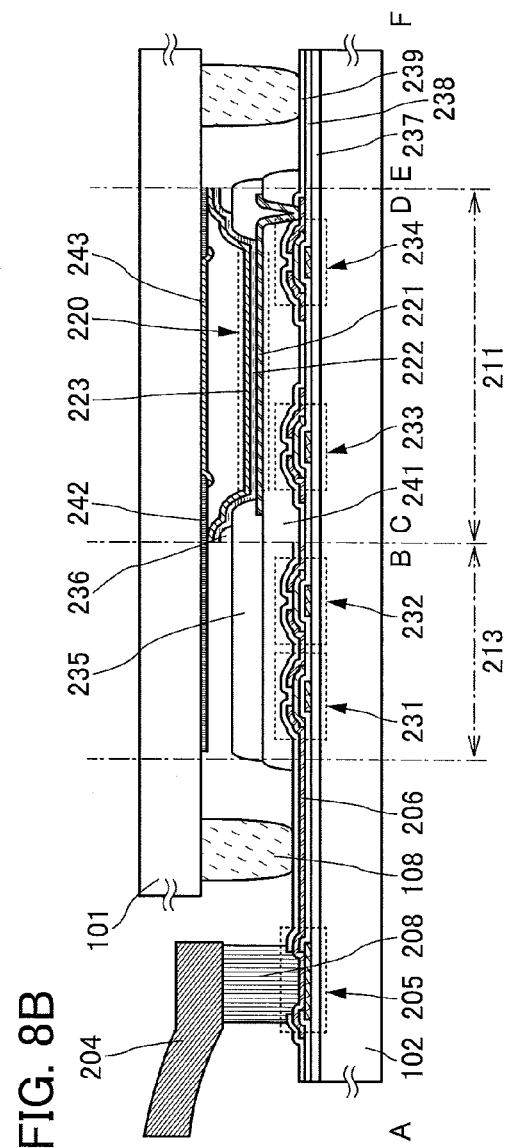

FIG. 8B is a schematic cross-sectional view of a region including the FPC 204 and the gate driver circuit 213 along the section line A-B, a region including the display portion 211 along the section line C-D, and a region including the glass layer 108 along the section line E-F, in the display device 200 illustrated in FIG. 8A.

The second substrate 102 and the first substrate 101 are bonded to each other with the glass layer 108 at the outer edge portion of the first substrate 101. Further, at least a light-emitting element 220 is provided in the sealed region surrounded by the first substrate 101, the second substrate 102, and the glass layer 108.

In FIG. 8B, the gate driver circuit 213 includes a circuit in which n-channel transistors, transistors 231 and 232, are used in combination, as an example. Note that the gate driver circuit 213 is not limited to this structure and may include various CMOS circuits in which an n-channel transistor and a p-channel transistor are used in combination or a circuit in which p-channel transistors are used in combination. Note that the same applies to the source driver circuit 212. Although a driver-integrated structure in which the gate driver circuit 213 and the source driver circuit 212 are formed over an insulating surface provided with the display portion 211 is described in this embodiment, the gate driver circuit 213 or the source driver circuit 212, or both may be formed over a surface different from the insulating surface provided with the display portion 211. For example, a driver circuit IC may be mounted by a COG method, or a flexible substrate (FPC) mounted with a driver circuit IC by a COF method may be mounted.

Note that there is no particular limitation on the structures of the transistors included in the display portion 211, the source driver circuit 212, and the gate driver circuit 213. For example, a forward staggered transistor or an inverted staggered transistor may be used. Further, a top-gate transistor or a bottom-gate transistor may be used. As a semiconductor material used for the transistors, for example, a semiconductor material such as silicon or germanium, a compound semiconductor material, an organic semiconductor material, or an oxide semiconductor material containing at least one of indium, gallium, and zinc may be used.

Further, there is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of transistor characteristics can be reduced.

Typical examples of the oxide semiconductor containing at least one of indium, gallium, and zinc include an In—Ga—Zn-based metal oxide, and the like. An oxide semiconductor having a wider band gap and a lower carrier density than silicon is preferably used because off-state leakage current can be reduced.

FIG. 8B shows a cross-sectional structure of one pixel as an example of the display portion 211. One pixel in the display portion 211 includes a switching transistor 233, a current control transistor 234, and a first electrode 221 that is electrically connected to one electrode (a source electrode or a drain electrode) of the transistor 234. An insulating layer 235 is provided so as to cover an end portion of the first electrode 221, and a spacer 236 is provided over the insulating layer 235 in a region overlapping with the black matrix 242. When a plurality of spacers 236 is provided in the display portion 211, the second substrate 102 and the first substrate 101 can be prevented from getting unnecessarily close to each other, and the display device can have high reliability.

Although the spacer 236 is provided on the second substrate 102 side in FIG. 8B, the spacer 236 may be provided on the first substrate 101 side. For example, the spacer 236 is provided in a position overlapping with the black matrix 242. Further, when a surface of the spacer 236 has conductivity and the surface of the spacer 236 is provided in contact with the second electrode 223 of the light-emitting element 220, the spacer 236 can also be used as an auxiliary wiring which is electrically connected to the second electrode 223. In particular, the spacer 236 serving as an auxiliary wiring is effective in the case of using a light-transmitting conductive material having relatively high resistivity for the second electrode 223.

The light-emitting element 220 includes the first electrode 221, the second electrode 223, and an EL layer 222 provided between the first electrode 221 and the second electrode 223. The light-emitting element 220 will be described below.

In the light-emitting element 220, a light-transmitting material that transmits light emitted from the EL layer 222 is used for an electrode provided on the light exit side.

As the light-transmitting material, a conductive oxide such as indium oxide, indium tin oxide, indium zinc oxide, zinc oxide, zinc oxide to which gallium is added, graphene, or the like can be used. Other examples include a metal material such as gold, silver, platinum, magnesium, nickel, tungsten, chromium, molybdenum, iron, cobalt, copper, palladium, or titanium and an alloy material containing any of these metal materials. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive layer. For example, a stack of an alloy of silver and magnesium and indium tin oxide is preferably used because the conductivity can be increased.

The conductive film formed using such a material is formed by a vacuum evaporation method, a sputtering method, or the like. A discharging method such as an ink-jet method, a printing method such as a screen printing method, a plating method, or the like may be used.

Note that when the above conductive oxide having a light-transmitting property is formed by a sputtering method, the use of a deposition atmosphere containing argon and oxygen allows the light-transmitting property to be increased.

Further, in the case where a film of the conductive oxide is formed over the EL layer 222, it is preferable to stack a first conductive oxide film formed under an atmosphere containing argon with reduced oxygen concentration and a second conductive oxide film formed under an atmosphere containing argon and oxygen, in which case damage to the EL layer 222 due to film formation can be reduced. Here, the purity of an argon gas used for formation of the first conductive oxide film is preferably high, and for example, it is preferable to use the argon gas whose dew point is lower than or equal to −70° C., more preferably lower than or equal to −100° C.

For an electrode provided on a side opposite to the light exit side, a light-reflecting material which reflects the light emission is used.

As a light-reflecting material, a metal material such as aluminum, gold, platinum, silver, nickel, tungsten, chromium, molybdenum, iron, cobalt, copper, or palladium or an alloy material containing any of these metal materials can be used. Alternatively, lanthanum, neodymium, germanium, or the like may be added to any of the above the metal materials or the alloy materials. Examples of alloy materials include alloys containing aluminum (aluminum alloys) such as an alloy of aluminum and titanium, an alloy of aluminum and nickel, and an alloy of aluminum and neodymium, alloys containing silver such as an alloy of silver and copper, an alloy of silver, palladium, and copper, and an alloy of silver and magnesium, and the like. An alloy of silver and copper is preferable because of its high heat resistance. Further, when a metal film or a metal oxide film is stacked to be in contact with a film containing aluminum, oxidation of the film containing aluminum can be suppressed. As examples of the metal material or the metal oxide material in contact with the film containing aluminum, titanium and titanium oxide can be given. Alternatively, a stack of a film containing any of the above light-transmitting materials and a film containing any of the above metal materials may be used. For example, a stack of silver and indium tin oxide, a stack of an alloy of silver and magnesium and iridium tin oxide, or the like can be used.

Such an electrode is formed by a vacuum evaporation method, a sputtering method, or the like. Alternatively, a discharging method such as an ink-jet method, a printing method such as a screen printing method, or a plating method may be used.

The EL layer 222 includes at least a layer containing a light-emitting organic compound (hereinafter also referred to as a light-emitting layer), and may be either a single layer or a stack of plural layers. One example of the structure in which a plurality of layers is stacked is a structure in which a hole-injection layer, a hole-transport layer, a light-emitting layer, an electron-transport layer, and an electron-injection layer are stacked in this order from an anode side. Note that not all of these layers except the light-emitting layer are necessarily provided in the EL layer 222. Further, each of these layers may be provided in duplicate or more. Specifically, in the EL layer 222, a plurality of light-emitting layers may be stacked. Furthermore, another component such as a charge-generation region may be added as appropriate. Alternatively, a plurality of light-emitting layers exhibiting different colors may be stacked. For example, a white emission can be obtained by stacking two or more light-emitting layers of complementary colors.

The EL layer 222 can be fixated by a vacuum evaporation method, a discharging method such as an ink-jet method or a dispensing method, a coating method such as a spin-coating method, a printing method, or the like.

In this embodiment, a light-reflecting material is used for the first electrode 221, and a light-transmitting material is used for the second electrode 223. Thus, the light-emitting element 220 is a top-emission light-emitting element, and emits light to the first substrate 101 side.

The above is the description of the light-emitting element 220.

An insulating layer 237 in contact with an upper surface of the second substrate 102, an insulating layer 238 functioning as a gate insulating layer of transistors, and insulating layers 239 and 241 covering the transistors are provided over the second substrate 102.

The insulating layer 237 is provided in order to prevent diffusion of impurities included in the second substrate 102. The insulating layers 238 and 239, which are in contact with semiconductor layers of the transistors, are preferably formed using a material which prevents diffusion of impurities that promote degradation of the transistors. For these insulating layers, for example, an oxide, a nitride, or an oxynitride of a semiconductor such as silicon or a metal such as aluminum can be used. Alternatively, a stack of such inorganic insulating materials or a stack of such an inorganic insulating material and an organic insulating material may be used. Note that the insulating layer 237 and the insulating layer 239 are not necessarily provided.

The insulating layer 241 functions as a planarization layer which covers steps due to the transistors, a wiring, or the like provided therebelow. For the insulating layer 241, it is preferable to use a resin material such as polyimide or acrylic. An inorganic insulating material may be used as long as high planarity can be obtained. Note that the insulating layer 241 is not necessarily provided.

The wiring 206 provided over the second substrate 102 is provided so as to extend from the inside of the region sealed with the glass layer 108 to the outside and is electrically connected to the gate driver circuit 213 (or the source driver circuit 212). Part of an end portion of the wiring 206 forms part of the external connection electrode 205. In this embodiment, the external connection electrode 205 is formed by a stack of a conductive film which forms the source electrode and the drain electrode of the transistor and a conductive film which forms the gate electrode of the transistor. The external connection electrode 205 is preferably formed by a stack of a plurality of conductive films as described above because mechanical strength against a pressure bonding step performed on the FPC 204 or the like can be increased.

A connection layer 208 is provided in contact with a top surface of the external connection electrode 205. The FPC 204 is electrically connected to the external connection electrode 205 through the connection layer 208. For the connection layer 208, an anisotropic conductive film, an anisotropic conductive paste, or the like can be used.

A color filter 243 and the black matrix 242 are provided in a region overlapping with at least the display portion 211 on the first substrate 101.

The color filter 243 is provided in order to adjust the color of light emitted from the light-emitting element to increase the color purity. For example, in a full-color display device using white light-emitting elements, a plurality of pixels provided with color filters of different colors are used. In that case, the color filters may be those of three colors of R (red), G (green), and B (blue) or four colors (yellow (Y) in addition to these three colors). Alternatively, a white (W) pixel may be added to R, and B (and Y), i.e., color filters of four colors (or five colors) may be used.

Further, the black matrix 242 is provided between adjacent color filters 243. The black matrix 242 blocks light emitted from an adjacent pixel, thereby preventing color mixture between the adjacent pixels. In one configuration, the black matrix 242 may be provided only between adjacent pixels of different emission colors and not between pixels of the same emission color. When the color filter 243 is provided so that its end portion overlaps with the black matrix 242, light leakage can be reduced. The black matrix 242 can be formed using a material that blocks light emitted from the light-emitting element, for example, a metal material or a resin material including a pigment. Note that it is preferable to provide the black matrix 242 also in a region overlapping with the gate driver circuit 213 or the like, which is not the display portion 211, as illustrated in FIG. 8B, because undesired leakage of guided light or the like can be prevented.

In addition, an overcoat may be provided so as to cover the color filter 243 and the black matrix 242. The overcoat can suppress diffusion of impurities, which are included in the color filter 243 and the black matrix 242, into the sealed region. For the overcoat, a light-transmitting material is used, and an inorganic insulating material or an organic insulating material can be used.

Here, in FIGS. 8A and 8B, each of the insulating layer 235 and the insulating layer 241 formed using an organic insulating material is processed into an island shape inside the glass layer 108 and is not in contact with the glass layer 108. As described above, each of the layers including an organic material is preferably provided so as not to overlap with the glass layer 108 because the bonding strength between the glass layer 108 and the second substrate 102 can be improved. At this time, in the case where an inorganic insulating material, preferably, an inorganic oxide material is used for surfaces in contact with the glass layer 108 (including a surface of the second substrate 102), the bonding strength can be further improved.

The method for bonding substrates and the method for manufacturing a light-emitting device of one embodiment of the present invention can be applied to a display device described in this embodiment. Therefore, the light-emitting device has high productivity and high reliability.

This embodiment can be combined with any of the other embodiments disclosed in this specification as appropriate.

Example

In this example, evaluation results of airtightness of a sealing structure fabricated using the method for bonding substrates of one embodiment of the present invention are described.

Here, a calcium film was sealed in a fabricated sealing structure and the transmittance with respect to light was measured, whereby the airtightness was evaluated. By utilization of a feature in that the transmittance of a calcium film is reduced by reaction with water, the airtightness of the sealing structure can be evaluated by measurement of the transmittance.

<Fabrication of Sample>

First, a glass substrate was prepared as a first substrate.

A frit paste was applied onto one surface of the first substrate by a screen printing method. The frit paste was formed as a pattern into a continuous closed curve along the periphery of the first substrate to have a thickness of about 10 μm and a width of about 500 μm. After that, the first substrate was left at room temperature in an atmospheric pressure for about 30 minutes and then heat treatment was performed at about 140° C. for 20 minutes. Next, heat treatment was performed at about 450° C. for 1 hour. In such a manner, a binder or the like included in the frit paste was removed and a glass layer including a melted body obtained by melting glass frit was formed.

Next, a black matrix was formed over the first substrate. The black matrix was formed in the following manner after a color resist including carbon black (manufactured by Tokyo Ohka Kogyo Co., Ltd.: CFPR BK-4611) was applied with a spin coater and heat treatment was performed at 90° C., light exposure and development treatment were performed to remove an unnecessary portion and then heat treatment was performed at 220° C.

Next, a green color filter, a red color filter, and a blue color filter were formed sequentially by a method similar to the above. For the green color filter, a color resist including a green pigment (manufactured by FUJIFILM Corporation: CG-7001W) was used. For the red color filter, a color resist including a red pigment (manufactured by FUJIFILM Corporation: CR-7001W) was used. For the blue color filter, a color resist including a blue pigment (manufactured by FUJIFILM Corporation: CB-7001W) was used.

At this time, it was confirmed that the pigments included in the carbon black and the color filters were attached to part of a top surface of the glass layer.

Next, a glass substrate was prepared as a second substrate.

A calcium film was deposited on one surface of the second substrate to a thickness of about 50 nm by a vacuum evaporation method.

After that, the first substrate and the second substrate were disposed so that the surface over which the glass layer, the color filters, and the like were provided and the surface on which the calcium film was provided face to each other. Next, in a state where part of the glass layer was attached closely to the second substrate, the glass layer was irradiated with laser light while scanning was performed from the second substrate side, whereby the first substrate and the second substrate were bonded to each other with the glass layer. The laser light irradiation was performed under the following conditions: a semiconductor laser with a wavelength of 940 nm was used, the output power was 28 W, and the scanning speed was 1 mm/sec.

A sealing body in which the black matrix, the three kinds of color filters, and the calcium film were sealed in a sealed region surrounded by the first substrate, the second substrate, and the glass layer was obtained as a sample by the above method. Four samples were fabricated through the same process.

<Fabrication of Comparative Sample>

As a comparative sample for evaluating the airtightness of the above samples, a sample fabricated through a process in which the black matrix and the color filters were not formed was used.

First, as in the above, the glass layer was formed over the first substrate. After that, without the formation of the black matrix and the color filters, as in the above, the second substrate on which the calcium film was provided and the first substrate were bonded to each other with the glass layer.

Here, conditions of laser light irradiation were the same as the conditions described above.

A sealing body in which the calcium film was sealed in the sealed region surrounded by the first substrate, the second substrate, and the glass layer was obtained as a comparative sample by the above method. Three comparative samples were fabricated through the same process.

<Evaluation of Airtightness>

In order to evaluate the airtightness of the fabricated samples and the fabricated comparative samples, a preservation test was conducted on the samples at temperature of 65° C. and humidity of 90% and changes over time in the transmittances of the calcium films during the test was measured.

Figure 9A:
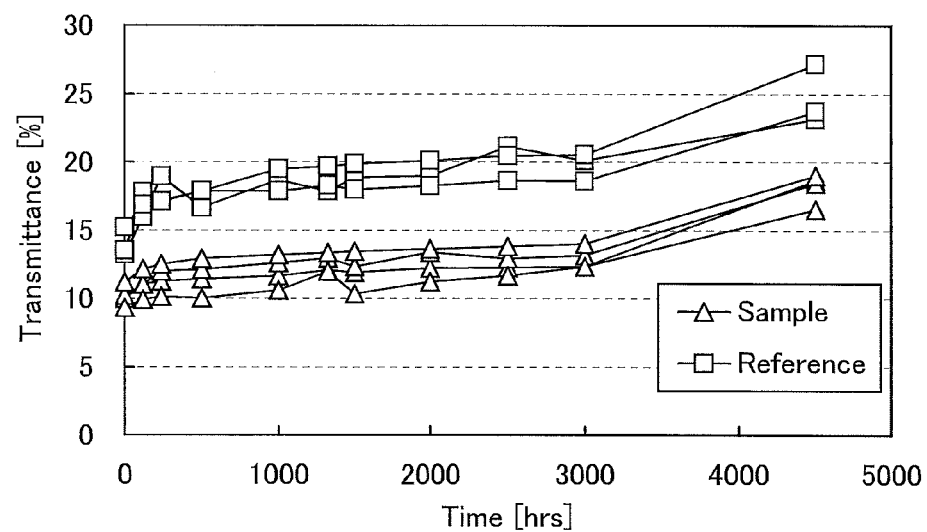
FIGS. 9A and 9B show changes over time of the transmittances of the calcium films and changes over time in the change rates of the transmittances of the calcium films, respectively.

FIG. 9A shows the changes over time in the transmittances with respect to light having a wavelength of 700 nm of the calcium films of the samples. In FIG. 9A, triangular markers and square markers represent measurement results of the samples and measurement results of the comparative samples, respectively.

From these results, it is confirmed that although the two kinds of samples were fabricated under the same conditions after the formation step of the calcium film, the transmittances of the calcium films of the samples provided with the color filters are lower than those of the calcium films of the comparative samples which are not provided with the color filters from the early stage of measurement. From these results, it can be confirmed that the humidity in the sealed regions of the samples which are not provided with the color filters is lower than that in the sealed regions of the samples which are not provided with the color filters and it can be considered that the color filters also function as drying agents.

Figure 9B:
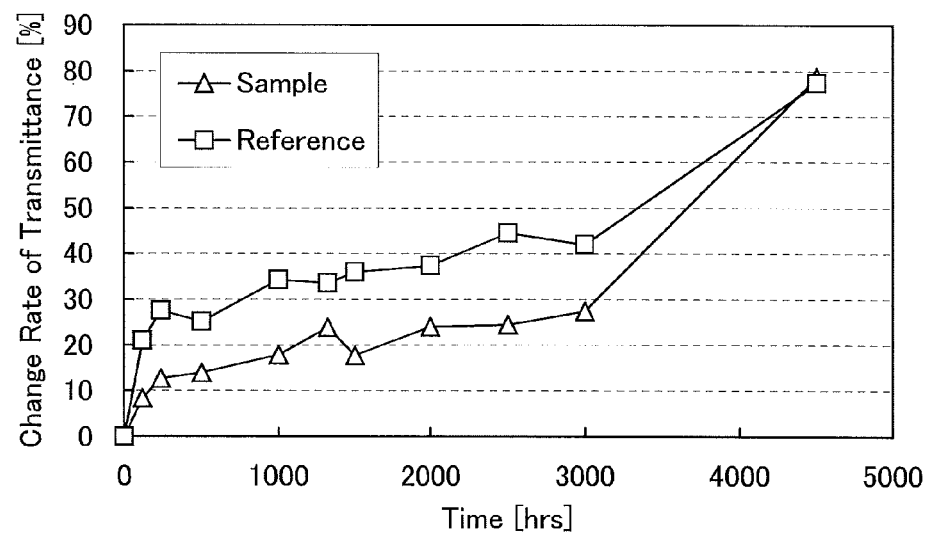

FIG. 9B shows changes over time in the change rates of the transmittances at the start of measurement, which are derived from the results in FIG. 9A. Here, in FIG. 9B, the average value of the four samples provided with the color filters and the average value of the three comparative samples which are not provided with the color filters are calculated and the changes over time in the average values are shown.

It is found that the changes in the change rates of the transmittances at the samples provided with the color filters tend to be lower than those of the comparative samples which are not provided with the color filters. That is, it is confirmed that in the case of the same conditions of laser light irradiation, the samples provided with the color filters are superior to the comparative samples in airtightness.

From the above results, it was confirmed that with the use of the method for bonding substrates of one embodiment of the present invention, a sealing structure having high airtightness can be manufactured.

This application is based on Japanese Patent Application serial no. 2012-236832 filed with Japan Patent Office on Oct. 26, 2012, the entire contents of which are hereby incorporated by reference.

What is claimed is:

1. A method for bonding substrates, comprising the steps of:
   forming a glass layer comprising a glass frit over a first substrate;
   applying a resin including a light-absorbing material over the glass layer and the first substrate;
   removing the resin partially so that the light-absorbing material is put on a portion of an uneven surface of the glass layer;
   attaching the glass layer to a second substrate; and
   irradiating the glass layer and the light-absorbing material with laser light so that the glass layer is welded to the first substrate and the second substrate.

2. The method for bonding the substrates according to claim 1, wherein the light-absorbing material is an organic pigment, an inorganic pigment, or a color filter material.

3. The method for bonding the substrates according to claim 1, wherein an end portion of the glass layer has a tapered shape.

4. The method for bonding the substrates according to claim 1, wherein the laser light is scanned along the glass layer.

5. A method for manufacturing a light-emitting device, comprising the steps of:
   forming a glass layer comprising a glass frit over a first substrate;

applying a resin including a light-absorbing material over the glass layer and the first substrate,
- removing the resin partially so that the light-absorbing material is put on a portion of an uneven surface of the glass layer, and a light-absorbing layer including the light-absorbing material is formed over the first substrate;

forming a light-emitting element over a second substrate;

attaching the glass layer to the second substrate; and irradiating the glass layer and the light-absorbing material with laser light so that the glass layer is welded to the first substrate and the second substrate, wherein the glass layer surrounds the light-emitting element without an endpoint.

6. The method for manufacturing the light-emitting device according to claim 5, wherein the light-absorbing layer including the light-absorbing material is a color filter.

7. The method for manufacturing the light-emitting device according to claim 5, wherein an end portion of the glass layer has a tapered shape.

8. The method for manufacturing the light-emitting device according to claim 5, wherein the laser light is scanned along the glass layer.

* * * * *